(12) United States Patent
Åhgren

(10) Patent No.: US 8,688,758 B2
(45) Date of Patent: Apr. 1, 2014

(54) SYSTEMS AND METHODS FOR FILTERING A SIGNAL

(75) Inventor: Per Åhgren, Knivsta (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 402 days.

(21) Appl. No.: 13/140,223

(22) PCT Filed: Dec. 18, 2008

(86) PCT No.: PCT/SE2008/051513
§ 371 (c)(1),
(2), (4) Date: Jun. 16, 2011

(87) PCT Pub. No.: WO2010/071519
PCT Pub. Date: Jun. 24, 2010

(65) Prior Publication Data
US 2011/0252077 A1   Oct. 13, 2011

(51) Int. Cl.
*G06F 17/10* (2006.01)

(52) U.S. Cl.
USPC .......................................... 708/300; 708/309

(58) Field of Classification Search
None
See application file for complete search history.

(56) References Cited

U.S. PATENT DOCUMENTS

| 5,506,798 A | 4/1996 | Shimada et al. |
| 5,648,987 A * | 7/1997 | Yang et al. ................ 375/232 |
| 5,943,429 A | 8/1999 | Handel |
| 7,113,559 B2 * | 9/2006 | Baas et al. ................ 375/350 |
| 2001/0056450 A1 * | 12/2001 | Kiriaki ................ 708/300 |
| 2004/0145502 A1 * | 7/2004 | Thomson ................ 341/61 |
| 2005/0117489 A1 | 6/2005 | Serizawa |

FOREIGN PATENT DOCUMENTS

| EP | 1 947 776 A1 | 7/2008 |
| JP | 64-061178 | 3/1989 |
| JP | 03-058510 | 3/1991 |
| JP | 2008-011376 | 1/2008 |

OTHER PUBLICATIONS

International Preliminary Report on Patentability issued for International Application No. PCT/SE2008/051513 on Mar. 10, 2011.

(Continued)

*Primary Examiner* — Michael D Yaary
(74) *Attorney, Agent, or Firm* — Myers Bigel Sibley & Sajovec

(57) ABSTRACT

Methods for filtering an input signal x(k) to produce an output signal y(k) such that the ratio of a power level of the output signal to a power level of the input signal is substantially equal to a desired value γ are provided. The methods include forming a first corrected frequency response $\overline{H}(\omega)$ based on a first correction value $g_{corr}(0)$ and a desired frequency response $H(\omega)$; forming a first filter $\overline{h}(z)$ from the first corrected frequency response $\overline{H}(\omega)$; applying the first filter $\overline{h}(z)$ to a first block of the input signal to produce a first output signal block; computing an amplification $\overline{\gamma}$ caused by the application of the filter $\overline{h}(z)$; computing a value $\gamma_{diff}$, wherein $\gamma_{diff}$ represents an amplification error; computing a second correction value $g_{corr}(1)$, where $g_{corr}(1)$ is a function of $g_{corr}(0)$ and $\gamma_{diff}$; forming a second corrected frequency response $\overline{H}(\omega)$ based on the second correction value $g_{corr}(1)$ and the desired frequency response $H(\omega)$; forming a second filter $\overline{h}(z)$ from the second corrected frequency response $\overline{H}(\omega)$; and applying the second filter $\overline{h}(z)$ to a second block of the input signal to produce a second output signal block.

21 Claims, 5 Drawing Sheets

(56) References Cited

OTHER PUBLICATIONS

Written Opinion of the International Searching Authority issued for International Application No. PCT/SE2008/051513 on Sep. 23, 2009.

Bastian et al. "Near End Listening Enhancement with Strict Loudspeaker Output Power Constraining" ICASSP 2006, IEEE International Conference on Acoustics, Speech and Signal Processing, May 14-19, 2006, pp. I-493-I-496.

* cited by examiner

SYSTEMS AND METHODS FOR FILTERING A SIGNAL

CROSS REFERENCE TO RELATED APPLICATION

This application is a 35 U.S.C. §371 national stage application of PCT International Application No. PCT/SE2008/051513, filed on 18 Dec. 2008, the disclosure of which is incorporated by reference herein as if set forth in its entirety. The above-referenced PCT International Application was published in the English language as International Publication No. WO 2010/071519 A1 on Jun. 24, 2010.

TECHNICAL FIELD

The present invention relates to systems and method for filtering a signal. For example, in one aspect, the invention relates to a time-domain finite impulse response (FIR) filter designed from a desired frequency response for the case when it is desired that the application of the FIR filter should add a certain amplification to the average power of the signal it is applied to. In some embodiments, the invention addresses the particular case when the filtering operations are performed in fix-point on a digital signal processor (DSP).

BACKGROUND

In many applications (see e.g., B Sauert, G Enzner, and P. Vary, "Near end listening enhancement with strict loudspeaker output power constraining", International Workshop on Acoustic Echo and Noise Control, *IWAENC* 2006, September 12-14, Paris, France and U.S. Pat. No. 5,943,429) a desired filtering effect is achieved by filtering a signal via a linear filtering operation with a time-domain filter that has been designed to have a desired frequency response. Typically the desired effect varies with time and is designed based on the input signal. In some applications, the desired effect should not alter the average power level of the signal, and, hence, the desired frequency response should be designed so as to give a time-domain filter that does not alter the power level of the signal. Alternatively, a fixed gain of the average power level of the signal may be desired of the filtering operation.

On a DSP, filtering operations with FIR filters are usually performed using fix-point operations on signals represented by a limited number of bits: for audio signals typically 16 bits are used. In order to not lose precision in the output, it is desired that the filter coefficients in the FIR filter are properly scaled: if they are too large the filter output will saturate, and if they are too low some of the bits in the output will not be used and some precision will be lost. Therefore, in some applications it is better to incorporate all filtering effects in the filter coefficients, and not to perform the filtering as a combination of a filtering operation and a scaling operation.

J. Proakis and D. Manolakis, "Digital signal processing", Prentice Hall and U.S. Pat. No. 7,251,271 disclose methods for designing a time-domain FIR filter with a desired frequency response. In practice, for reasons of computational complexity, the order of the time-domain FIR filter needs often to be short. Furthermore, for the same reason, the desired frequency response is usually only computed for a limited number of frequencies.

The limited length of the FIR filter limits the accuracy by which its frequency response is able to approximate the desired frequency response, particularly when the dynamics of the desired frequency response are large. This may cause the amplification of the power of the signal output from the filtering operation to be different from what is desired, as the FIR filter is not able to fulfill the requirements posed by the desired frequency response that would ensure that the desired amplification of the average power of the input signal would be achieved in the output.

Furthermore, the same thing may happen due to the limited frequency resolution of the desired filter frequency response of the filter, even for the case when the frequency response of the time-domain FIR filter is identical to the desired filter frequency response.

The deceivingly simple way of correcting the power of the output from the filtering operation by a simple scaling of the output to the desired level does not work well using a fixed-point implementation of the filtering operation due to possible truncation and loss of precision in the output prior to the scaling.

A possible solution is to perform the filtering, and then, based on the power of the output, properly scale the coefficients of the FIR filter and perform the filtering a second time to form the final filter output. But an FIR filtering operation is expensive. Thus, from a computational point of view, this solution is not desired.

Another possible solution would be to properly normalize the filter output during the filtering operation. On a DSP this is computationally complex. Moreover, because the FIR filtering operation is a computationally demanding task, it typically needs to be fully optimized. Thus, it is generally not feasible to solve the problem in this manner.

What is desired are systems and methods that reduce the problem of improper amplification of the average power of the output of the filtering operation.

SUMMARY

In one aspect, the present invention provides systems and methods that reduce the problem of improper amplification of the average power of the output of the filtering operation by tracking the errors in the amplification of the output power and compensating for this.

In one aspect, the invention provides a method of filtering an input signal x(k) (using an FIR filter or other filter) to produce an output signal y(k) such that the ratio of a power level of the output signal (e.g., an average power level of the output signal) to a power level of the input signal (e.g., an average power level of the input signal) will be equal to or about equal to a desired value γ.

In some embodiments, this method includes the following steps: (1) forming a first corrected frequency response $\bar{H}(\omega)$ based on a first correction value $g_{corr}(0)$ and a desired frequency response H(ω); (2) forming a first filter $\bar{h}(z)$ from the first corrected frequency response $\bar{H}(\omega)$; and (3) applying the first filter $\bar{h}(z)$ to a first block of the input signal to produce a first output signal block. In some embodiments, an FIR filter is used to perform the filtering operation, and in other embodiments other types of filters are used. In some embodiments, H(ω) (and thus $\bar{h}(z)$) is time varying.

The method, in some embodiments, further includes the steps of: (4) computing the amplification $\bar{\gamma}$ caused by the application of the filter $\bar{h}(z)$; (5) computing a value $\gamma_{diff}$, wherein $\gamma_{diff}$ represents an amplification error; (6) computing a second correction value $g_{corr}(1)$, where $g_{corr}(1)$ is a function of $g_{corr}(0)$ and $\gamma_{diff}$; (7) forming a second corrected frequency response $\bar{H}(\omega)$ based on the second correction value $g_{corr}(1)$ and the desired frequency response H(ω); (8) forming a second filter $\bar{h}(z)$ from the second corrected frequency response $\overline{H}(\omega)$; and (9) applying the second filter $\overline{h}(z)$ to a second block of the input signal to produce a second output signal block.

The step of computing $\gamma_{diff}$ may comprise computing $\gamma/\overline{\gamma}$. In some embodiments, the first block of the input signal comprises M samples $x(1M-k)$, $k=0, \ldots, M-1$, and the first block of the output signal comprises M samples $y(1M-k)$, $k=0, \ldots, M-1$, and the step of applying the first filter $\overline{h}(z)$ to the first block of the input signal to produce the first output signal block comprises computing $\overline{h}(z)x(1M-k)$, $k=0, \ldots, M-1$.

In some embodiments, the method also includes computing a first corrected output signal block comprising M samples by computing $$\sqrt{\frac{g_{corr}(1)}{g_{corr}(0)}} y(1M-k), k=0, \ldots, M-1.$$

In some embodiments, the step of computing the amplification $\overline{\gamma}$ comprises computing $$\frac{\sum_{k=0}^{M-1} y^2(1M-k)}{\sum_{k=0}^{M-1} x^2(1M-k)}, k=0, \ldots, M-1.$$

In some embodiments, $g_{corr}(1)=(1-\lambda)g_{corr}(0)+\lambda\gamma_{diff}g_{corr}(0)$, wherein $\lambda$ is a forgetting factor.

In some embodiments, the input signal represents a sound wave, wherein the sound wave was caused, at least in part, by a person speaking. In this embodiment, the method may further include providing the output signal $y(k)$, or a signal obtained from $y(k)$, to a transducer configured to convert the provided signal into sound.

In some embodiments, the method is performed by a communication device that receives from another communication device the input signal $x(k)$ or a signal from which $x(k)$ was obtained.

In another aspect, the present invention provides an apparatus for filtering an input signal $x(k)$ to produce an output signal $y(k)$ such that the ratio of a power level of the output signal to a power level of the input signal will be equal to or about equal to a desired value $\gamma$. In some embodiments, the apparatus includes: (1) a corrected frequency response foaming module configured to form a first corrected frequency response $\overline{H}(\omega)$ based on a first correction value $g_{corr}(0)$ and a desired frequency response $H(\omega)$; (2) a filter forming module configured to form a first filter $\overline{h}(z)$ from the first corrected frequency response $\overline{H}(\omega)$; and (3) a filter applying module configured to apply the first filter $\overline{h}(z)$ to a first block of the input signal to produce a first output signal block.

The above and other aspects and embodiments are described below with reference to the accompanying drawings.

BRIEF DESCRIPTION OF THE DRAWINGS

The accompanying drawings, which are incorporated herein and form part of the specification, illustrate various embodiments of the present invention and, together with the description, further serve to explain the principles of the invention and to enable a person skilled in the pertinent art to make and use the invention. In the drawings, like reference numbers indicate identical or functionally similar elements.

DETAILED DESCRIPTION

An objective of the invention is to filter an input signal $x(t)$ with an FIR filter $h(z)$, which is designed to have a desired frequency response $H(\omega)$, to produce an output signal $y(t)$, such that, among other things, a ratio of a power level of the output signal $P(y(t))$ to a power level of the input signal $P(x(t))$ equals or substantially equals a desired ratio $\gamma$. Mathematically, $y(t)=h(z)x(t)$ and $P(y(t))=\gamma P(x(t))$. In some embodiments $$P(y(t)) = \frac{1}{M}\sum_{k=0}^{M-1} y^2(t-k) \text{ and } P(x(t)) = \frac{1}{M}\sum_{k=0}^{M-1} x^2(t-k)$$

$H(\omega)$ may be specified for a discrete number L of frequencies $\omega$, (128 and 256 being typical values for L) and is designed to have a desired effect on $x(t)$. In particular, it is desired that the effect of the filtering operation on the average power of $y(t)$ should be a desired specific level of amplification. Typically, the design of $H(\omega)$ is made based on $x(t)$ and its spectral properties, making it theoretically feasible to always achieve the desired amplification of the power of the input signal.

Figure 1:
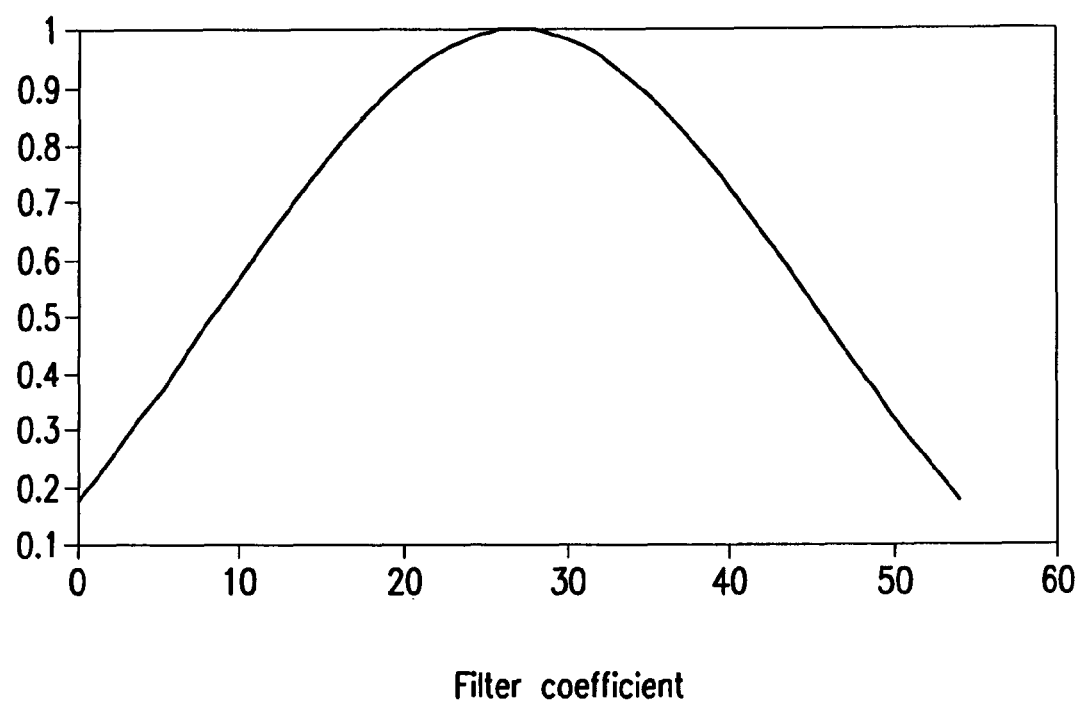
FIG. 1 illustrates a weighting filter.

The typical way of forming the coefficients $h_k$ of $h(z)$ is using the inverse Fourier transform (IFFT)

$$\tilde{h}_k = \frac{1}{L}\left(\sum_{\omega=0}^{L-1} H^*(\omega)e^{j\frac{2\pi}{L}\omega k}\right), k=0, \ldots, L-1$$

$$h_k = w_k \tilde{h}_{|D-k|}, k=0, \ldots, 2D,$$

where $D = \frac{N-1}{2}$, $N \leq L$ is the length of $h(z)$, and $w_k$ are the coefficients of a truncation weighting filter. One particular choice of such a filter is shown in FIG. 1. This process is further described in U.S. Pat. No. 7,251,271. The so-obtained filter $h(z)$ is in linear-phase with a delay D. However, a minimum-phase filter with zero delay may easily be constructed from $h(z)$ using techniques such as spectral factorization. Herein, a filter delay of 0 is assumed. The invention is, however, not limited to using this particular delay.

The averaging of the power levels is typically done over a time window. Thus it is desired that $$\frac{1}{M}\sum_{k=0}^{M-1} y^2(t-k) = \gamma \frac{1}{M}\sum_{k=0}^{M-1} x^2(t-k)$$

where $\gamma$ is the desired amplification of $x(t)$ ($\gamma=1$ means that the average power level of the signal is unaltered).

In general, due to the problems of limited length of $h(z)$ and limited resolution of $H(\omega)$, the actual amplification $\overline{\gamma}$ achieved through the filtering operation differs from the desired amplification $\gamma$, i.e., $$\frac{1}{M}\sum_{k=0}^{M-1} y^2(t-k) = \tilde{\gamma}\frac{1}{M}\sum_{k=0}^{M-1} x^2(t-k) \neq \gamma\frac{1}{M}\sum_{k=0}^{M-1} x^2(t-k)$$

Figure 2:
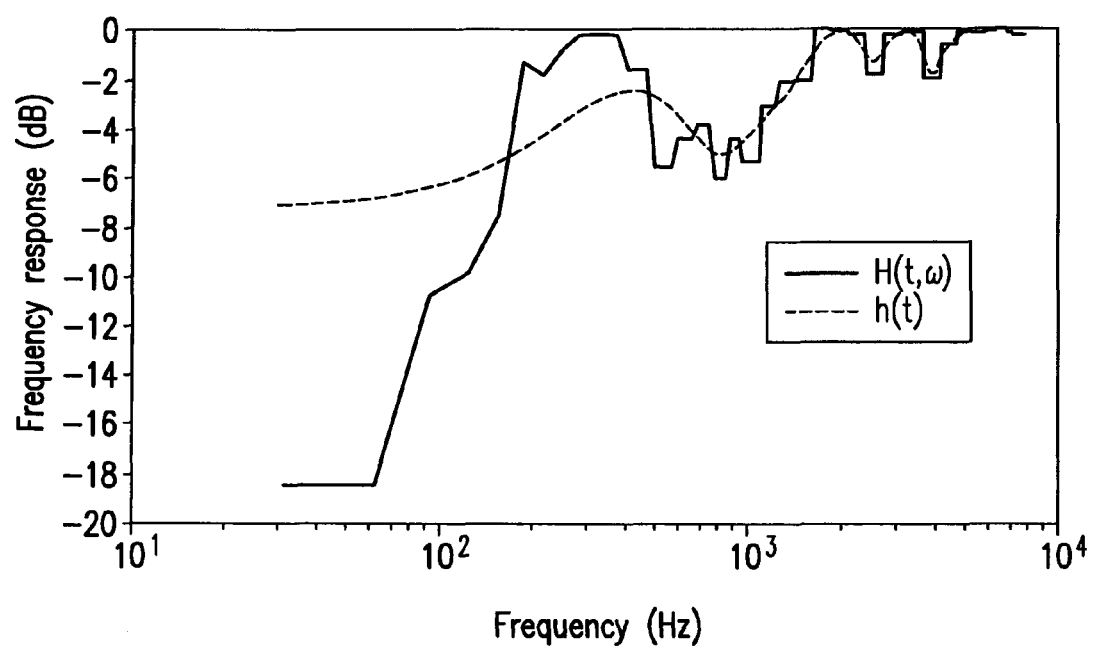
FIG. 2 is a plot showing a desired frequency response and an actual frequency response.

FIG. 2 illustrates a typical example when this may happen. $H(\omega)$ is designed based on M samples of a certain input signal x'(t) to give a certain attenuation γ' of x'(t). Since the frequency response of h(z) differs from the desired frequency response $H(\omega)$, the obtained attenuation will for most input signals differ from γ'. For instance, in this particular case, should x'(t) have much of its energy below 100 Hz, the difference in attenuation from γ' will be huge as h(z) poorly approximates $H(\omega)$ below 100 Hz.

For the sake of simplicity and convenience, the invention will be described for the case where the averaging is performed over M samples, $H(\omega)$ will be computed for these M samples, and h(z) will be applied to these M samples. However, the invention is not limited to this particular arrangement.

The embodiment described here reduces the amount by which $\tilde{\gamma}$ differs from γ. The embodiment achieves this by using an adaptive recursive procedure 300 (see FIG. 3).

Figure 3:
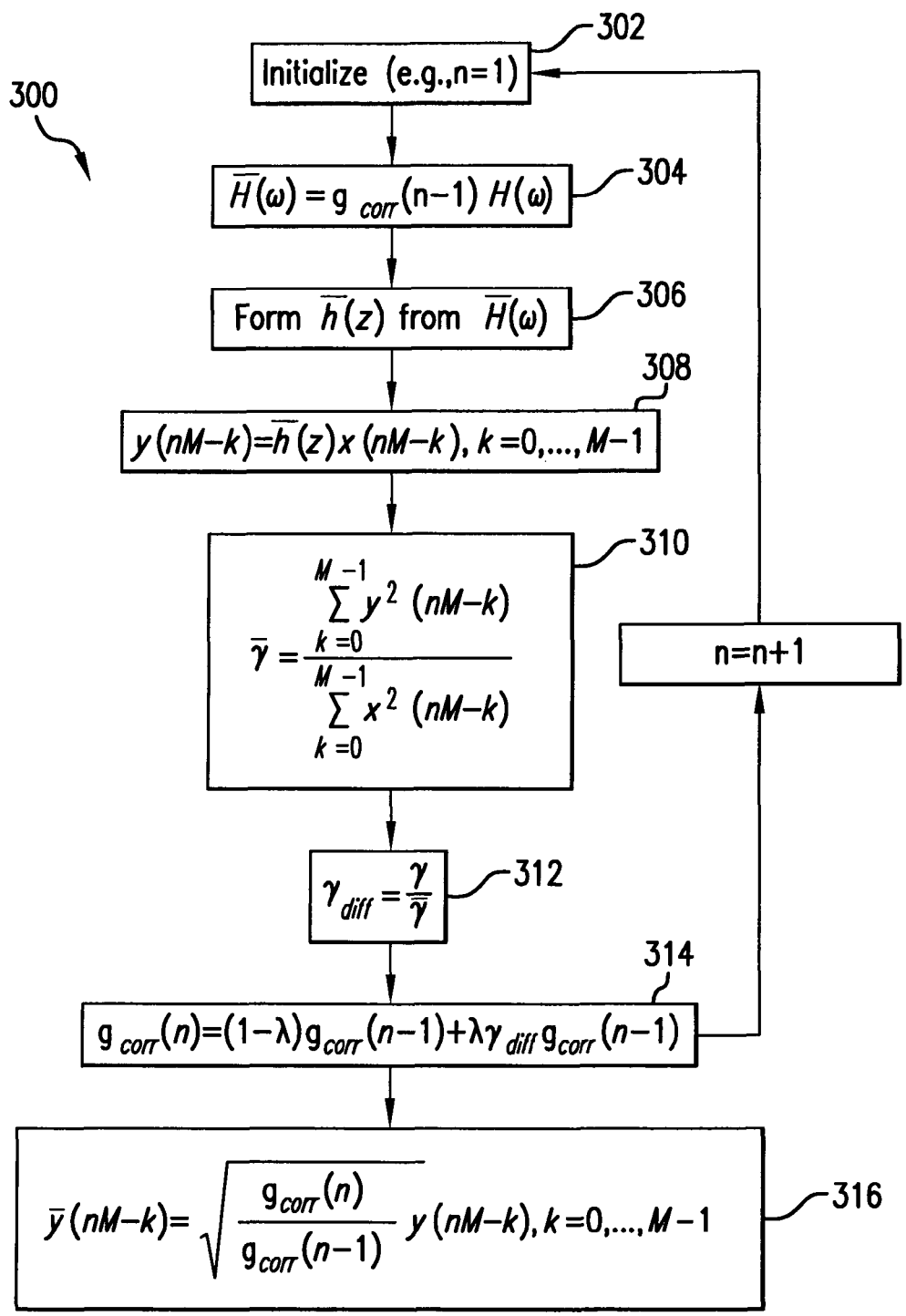
FIG. 3 is a flow chart illustrating a process according to some embodiments of the invention.

Referring now to FIG. 3, FIG. 3 is a flow chart illustrating adaptive recursive procedure 300. As shown in FIG. 3, procedure 300 may begin in step 302, where an initialization takes place. For example, certain values, such as n, are set to initial values (e.g., n=1).

Next (step 304) a corrected frequency response $\overline{H}(\omega)$ is formed based on a correction value $g_{corr}(n-1)$. For example, $\overline{H}(\omega)$ may be formed by computing $g_{corr}(n-1)H(\omega)$ (i.e, $\overline{H}(\omega)=g_{corr}(n-1)H(\omega)$).

Next (step 306) a corrected filter $\overline{h}(z)$ is formed from the corrected frequency response $\overline{H}(\omega)$. This step can be accomplished by using a technique described in U.S. Pat. No. 7,251,271.

Next (step 308) the corrected filter $\overline{h}(z)$ is applied to a block of the input signal x(t) to produce a block of the output signal y(t). For example, step 308 involves computing y(nM−k)= $\overline{h}(z)x(nM-k)$, k=0, . . . , M−1.

Next (step 310), the resulting amplification $\tilde{\gamma}$ of the input signal is computed. That is, the ratio of the power level of the output signal block to the power level of the input signal block is computed. Mathematically, $$\tilde{\gamma} = \frac{\sum_{k=0}^{M-1} y^2(nM-k)}{\sum_{k=0}^{M-1} x^2(nM-k)}.$$

Next (step 312), the amplification error $\gamma_{diff}$ is computed. In some embodiments, $$\gamma_{diff} = \frac{\gamma}{\tilde{\gamma}}.$$

Next (step 314), a new correction gain $g_{corr}(n)$ is computed. In some embodiments, $g_{corr}(n)=(1-\lambda)g_{corr}(n-1)+\lambda\gamma_{diff}g_{corr}(n-1)$. The value λ is a predetermined forgetting factor for adapting $g_{corr}(n)$. After step 314, procedure 300 proceeds to step 316 and may also proceed to step 318. In step 316, n is incremented by 1. After step 316, procedure 300 returns to step 304.

In step 318, a corrected output signal block $\bar{y}(nM-k)$ is computed. In some embodiments, $\bar{y}(nM-k)$ is computed as follows:

$$\bar{y}(nM-k) = \sqrt{\frac{g_{corr}(n)}{g_{corr}(n-1)}}\, y(nM-k), k=0, \ldots, M-1.$$

Figure 4:
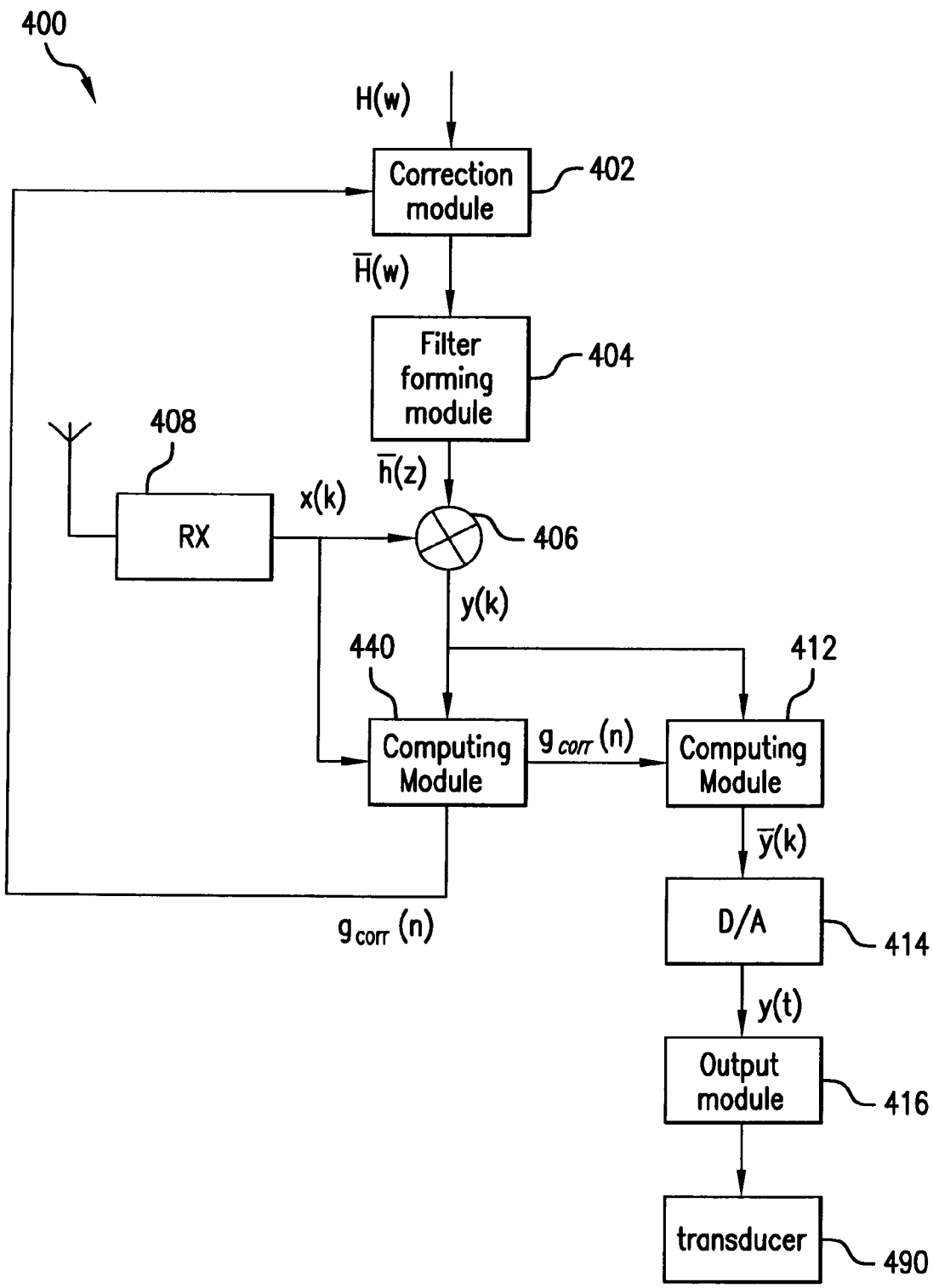
FIG. 4 is a functional block diagram of a device according to some embodiments of the invention.

Referring now to FIG. 4, FIG. 4 is a functional block diagram of a device 400, according to some embodiments of the invention, that is configured to implement procedure 300. As illustrated in FIG. 4, device 400 includes: (a) a corrected frequency response forming module 402 configured to produce a corrected frequency response based on an input frequency response $H(\omega)$ and a correction parameter $g_{corr}(n)$; (b) a filter forming module 404 configured to form a filter $\overline{h}(z)$ from the first corrected frequency response $\overline{H}(\omega)$; and (c) a filter applying module 406 configured to apply the filter $\overline{h}(z)$ to a block of an input signal x(k) to produce an output signal block.

As further shown in FIG. 4, device 400 includes a computing module 440 configured to (i) compute the amplification $\tilde{\gamma}$ caused by the application of the filter $\overline{h}(z)$; (ii) compute a value $\gamma_{diff}$, wherein $\gamma_{diff}$ represents an amplification error; and (iii) compute a correction value $g_{corr}(n)$, where $g_{corr}(n)$ is a function of $g_{corr}(n-1)$ and $\gamma_{diff}$.

Device 400 may also include a computing module 412. Computing module 412 is configured to compute a corrected output signal block based on the output signal block and the current and a previous correction value. Further, device 400 may include (i) a digital/analog converter 414 for converting the output signal block (or corrected output signal block) to an analog output signal and (ii) an output module 416 (e.g., an amplifier) that receives the analog output signal and provides the signal (or an amplified version of the signal) to a transducer 490 (e.g., a loudspeaker 490) for converting the analog output signal to speech.

Device 400 may further include a receiver 408 for receiving from another communication device an input signal x(k) or a signal from which x(k) can be obtained.

The above described modules of apparatus 400 may be implemented in hardware (e.g., using one or more processors including, for example, a microprocessor and/or a digital signal processor) and/or software.

In some embodiments, the apparatus shown in FIG. 4 may be part of a user's communication device (e.g., mobile phone or other communication device). A block diagram of communication device according to an embodiment of the invention is shown in FIG. 5.

Figure 5:
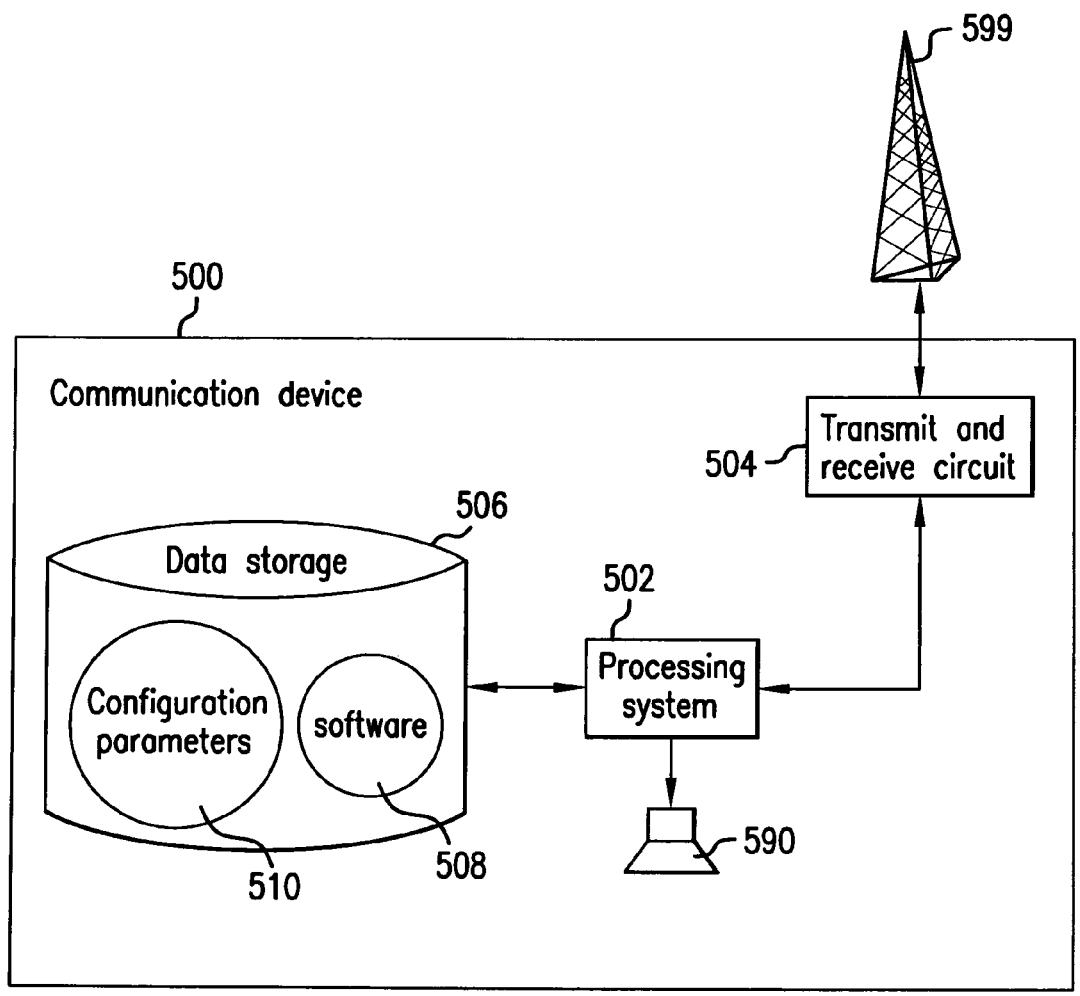
FIG. 5 is a functional block diagram of a device according to some embodiments of the invention.

Referring now to FIG. 5, FIG. 5 illustrates a communication device according to some embodiments of the invention. As shown, communication device 500 may comprise a data processing system 502 (e.g., one or more microprocessors, digital signal processors, and/or other processors), a data storage system 506 (e.g., one or more non-volatile storage devices), a transducer 590 coupled to processing system 502, and computer software 508 stored on the storage system 506. Configuration parameters 510 may also be stored in storage system 506. Communication device 500 also includes transmit/receive (Tx/Rx) circuitry 504 for transmitting data to and receiving data from a base station 599.

Software 508 is configured such that when processing system 502 executes software 508, communication device 500 performs steps described above with reference to the flow chart shown in FIG. 3. For example, software 508 may include: corrected frequency response forming module 402, which is configured to form a first corrected frequency response $\overline{H}(\omega)$ based on a first correction value $g_{corr}(0)$ and a desired frequency response $H(\omega)$; filter forming module 404 that is configured to form a first filter $\overline{h}(z)$ from the first corrected frequency response $\overline{H}(\omega)$; filter applying module 406 that configured to apply the first filter $\overline{h}(z)$ to a first block of the input signal to produce a first output signal block; and computing module 440 that is configured to (a) compute the amplification $\overline{\gamma}$ caused by the application of the filter $\overline{h}(z)$; (b) compute a value $\gamma_{diff}$ wherein $\gamma_{diff}$ represents an amplification error; and (c) compute a second correction value $g_{corr}(1)$, where $g_{corr}(1)$ is a function of $g_{corr}(0)$ and $\gamma_{diff}$.

While various embodiments of the present invention have been described above, it should be understood that they have been presented by way of example only, and not limitation. Thus, the breadth and scope of the present invention should not be limited by any of the above-described exemplary embodiments.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

What is claimed is:

1. A method of filtering an input signal x(k) to produce an output signal y(k) such that the ratio of a power level of the output signal to a power level of the input signal is substantially equal to a desired value γ, the method comprising, at least one of which is performed by a processor:
    forming a first corrected frequency response $\overline{H}(\omega)$ based on a first correction value $g_{corr}(0)$ and a desired frequency response $H(\omega)$;
    forming a first filter $\overline{h}(z)$ from the first corrected frequency response $\overline{H}(\omega)$;
    applying the first filter $\overline{h}(z)$ to a first block of the input signal to produce a first output signal block;
    computing an amplification $\overline{\gamma}$ caused by the application of the filter $\overline{h}(z)$;
    computing a value $\gamma_{diff}$, wherein $\gamma_{diff}$ represents an amplification error;
    computing a second correction value $g_{corr}(1)$, where $g_{corr}(1)$ is a function of $g_{corr}(0)$ and $\gamma_{diff}$;
    forming a second corrected frequency response $\overline{H}(\omega)$ based on the second correction value $g_{corr}(1)$ and the desired frequency response $H(\omega)$;
    forming a second filter $\overline{h}(z)$ from the second corrected frequency response $\overline{H}(\omega)$; and
    applying the second filter $\overline{h}(z)$ to a second block of the input signal to produce a second output signal block.

2. The method of claim 1, wherein computing $\gamma_{diff}$ comprises computing $$\frac{\gamma}{\overline{\gamma}}.$$

3. The method of claim 1:
    wherein the first block of the input signal comprises M samples x(1M−k), k=0, . . . , M−1;
    wherein the first block of the output signal comprises M samples y(1M−k), k=0, . . . , M−1;
    wherein applying the first filter $\overline{h}(z)$ to the first block of the input signal to produce the first output signal block comprises computing $\overline{h}(z)x(1M-k)$, k=0, . . . , M−1.

4. The method of claim 3, further comprising computing a first corrected output signal block comprising M samples by computing $$\sqrt{\frac{g_{corr}(1)}{g_{corr}(0)}}\, y(1M-k), k=0, \cdots, M-1.$$

5. The method of claim 1, wherein the step of computing the amplification $\overline{\gamma}$ comprises computing $$\frac{\sum_{k=0}^{M-1} y^2(1M-k)}{\sum_{k=0}^{M-1} x^2(1M-k)}, k=0, \cdots, M-1.$$

6. The method of claim 1, wherein $g_{corr}(1)=(1-\lambda)g_{corr}(0)+\lambda\gamma_{diff}g_{corr}(0)$ and wherein λ is a forgetting factor.

7. The method of claim 1:
    wherein the input signal represents a sound wave caused at least in part by a person speaking; and
    wherein the method further comprises providing one of the output signal y(k) and a signal obtained from y(k) to a transducer configured to convert the provided signal into sound.

8. The method of claim 1, wherein the filter is a digital filter and $H(\omega)$ is time varying.

9. The method of claim 8, wherein the digital filter is a finite impulse response (FIR) filter.

10. The method of claim 1, wherein the method is performed by a communication device that receives from another communication device one of the input signal x(k) and a signal from which x(k) was obtained.

11. An apparatus for filtering an input signal x(k) to produce an output signal y(k) such that the ratio of a power level of the output signal to a power level of the input signal is substantially equal to a desired value γ, the apparatus comprising:
    a corrected frequency response forming module configured to form a first corrected frequency response $\overline{H}(\omega)$ based on a first correction value $g_{corr}(0)$ and a desired frequency response $H(\omega)$;
    a filter forming module configured to form a first filter $\overline{h}(z)$ from the first corrected frequency response $\overline{H}(\omega)$;
    a filter applying module configured to apply the first filter $\overline{h}(z)$ to a first block of the input signal to produce a first output signal block;
    a computing module configured to;
    compute an amplification $\overline{\gamma}$ caused by the application of the filter $\overline{h}(z)$;
    compute a value $\gamma_{diff}$, wherein $\gamma_{diff}$ represents an amplification error; and
    compute a second correction value $g_{corr}(1)$, where $g_{corr}(1)$ is a function of $g_{corr}(0)$ and $\gamma_{diff}$;
    wherein the corrected frequency response forming module is further configured to form a second corrected frequency response $\overline{H}(\omega)$ based on the second correction value $g_{corr}(1)$ and the desired frequency response $H(\omega)$;
    wherein the filter forming module is further configured to form a second filter $\overline{h}(z)$ from the second corrected frequency response $\overline{H}(\omega)$;
    wherein the filter applying module is further configured to apply the second filter $\overline{h}(z)$ to a second block of the input signal to produce a second output signal block; and wherein the modules operate in conjunction with a processor.

12. The apparatus of claim 11, wherein computing module is configured to compute $\gamma_{diff}$ by computing $\gamma/\bar{\gamma}$.

13. The apparatus of claim 11:
wherein the first block of the input signal comprises M samples x(lM−k), k=0, ..., M−1;
wherein the first block of the output signal comprises M samples y(lM−k), k=0, ..., M−1; and
wherein the filter applying module is configured to apply the first filter $\bar{h}(z)$ to the first block of the input signal to produce the first output signal block by computing $\bar{h}(z)x(lM-k)$, k=0, ..., M−1.

14. The apparatus of claim 13, wherein the computing module is further configured to compute a first corrected output signal block comprising M samples by computing $$\sqrt{\frac{g_{corr}(1)}{g_{corr}(0)}}\, y(lM-k), k=0, \cdots, M-1.$$

15. The apparatus of claim 11, wherein the computing module is configured to compute the amplification $\bar{\gamma}$ by computing $$\frac{\sum_{k=0}^{M-1} y^2(lM-k)}{\sum_{k=0}^{M-1} x^2(lM-k)}, k=0,\ldots,M-1.$$

16. The apparatus of claim 11, wherein $g_{corr}(1)=(1-\lambda)g_{corr}(0)+\lambda\gamma_{diff}g_{corr}(0)$ and wherein $\lambda$ is a forgetting factor.

17. The apparatus of claim 11, wherein the input signal x(k) represents a sound wave, wherein the sound wave is caused at least in part by a person speaking.

18. The apparatus of claim 17, further comprising an output module configured to provide one of the output signal y(k) and a signal obtained from y(k) to a transducer configured to convert the provided signal into sound.

19. The apparatus of claim 11, further comprising a receiver configured to receive, from another communication device, one of the input signal x(k) and a signal from which x(k) can be obtained.

20. The apparatus of claim 11, wherein the power level of the output signal is an average power level of the output signal and the power level of the input signal is an average power level of the input signal.

21. The apparatus of claim 20, wherein the average power level of the output signal is equal to $$\frac{1}{M}\sum_{k=0}^{M-1} y^2(t-k)$$

and the average power level of the input signal is equal to $$\frac{1}{M}\sum_{k=0}^{M-1} x^2(t-k).$$

* * * * *

UNITED STATES PATENT AND TRADEMARK OFFICE
CERTIFICATE OF CORRECTION

Page 1 of 1

PATENT NO. : 8,688,758 B2
APPLICATION NO. : 13/140223
DATED : April 1, 2014
INVENTOR(S) : Per Åhgren It is certified that error appears in the above-identified patent and that said Letters Patent is hereby corrected as shown below:

In the specification

In Column 1, Line 15, delete "TECHNICAL FIELD" and insert -- FIELD --, therefor.

In Column 3, Lines 47-48, delete "foaming" and insert -- forming --, therefor.

In the claims

In Column 7, Line 10 after value, delete "$\gamma_{diff}$" and insert -- $\gamma_{diff}$, --, therefor.

In Column 7, Line 10 after wherein, delete "$\gamma_{diff}$" and insert -- $\gamma_{diff}$ --, therefor.

Signed and Sealed this
Twenty-ninth Day of December, 2015

Michelle K. Lee
*Director of the United States Patent and Trademark Office*